(12) United States Patent
Kim et al.

(10) Patent No.: US 7,092,147 B2
(45) Date of Patent: Aug. 15, 2006

(54) BROADBAND LIGHT SOURCE

(75) Inventors: Sang-Ho Kim, Suwon-si (KR); Seong-Taek Hwang, Pyeongtaek-si (KR); Se-Hong Park, Seoul (KR); Kwan-Woong Song, Seongnam-si (KR); Gyu-Woong Lee, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 49 days.

(21) Appl. No.: 10/858,913

(22) Filed: Jun. 2, 2004

(65) Prior Publication Data

US 2005/0185259 A1   Aug. 25, 2005

(30) Foreign Application Priority Data

Dec. 22, 2003  (KR) .................. 10-2003-0094671

(51) Int. Cl.
  *H01S 3/00* (2006.01)
(52) U.S. Cl. .................. 359/333; 359/341.1
(58) Field of Classification Search ......... 359/333, 359/341.1
  See application file for complete search history.

(56) References Cited

U.S. PATENT DOCUMENTS 6,658,189 B1 * 12/2003 Ajima et al. ............. 385/123
6,900,885 B1 *  5/2005 Masuda et al. ........... 356/147

FOREIGN PATENT DOCUMENTS

JP    2004193244 A  *  7/2004

* cited by examiner

*Primary Examiner*—Mark Hellner
(74) *Attorney, Agent, or Firm*—Cha & Reiter, L.L.C.

(57) ABSTRACT

A broadband light source includes an optical amplifier having amplifying mediums connected in series outputs an amplified spontaneous emission light over a wide wavelength range forward or backward. A circulator connected in series to the optical amplifier returns back to the amplifier spontaneous emission light outputted backwardly from the amplifier. A first pumping means located between the circulator and the optical amplifier pumps a pumping light to the optical amplifier, and a second pumping means located after the optical amplifier pumps a pumping light to the optical amplifier.

20 Claims, 6 Drawing Sheets

BROADBAND LIGHT SOURCE

CLAIM OF PRIORITY

This application claims priority to an application entitled "Broadband Light Source," filed in the Korean Intellectual Property Office on Dec. 22, 2003 and assigned Serial No. 2003-94671, the contents of which are hereby incorporated herein by reference.

BACKGROUND OF THE INVENTION

1. Field of the Invention

The present invention relates to a light source, and more particularly to a broadband light source capable of generating light over a wide wavelength range.

2. Description of the Related Art

Since a wavelength division multiplexed optical communication system widely used recently is an optical communication system for transmitting a plurality of channels of different wavelengths, each containing data, the system must include a plurality of optical devices such as optical transmission means for transmitting each of the channels and optical detection means for detecting respective optical signals having different wavelengths.

The optical devices constituting the wavelength division multiplexed optical communication system require a broadband light source for generating light over a wide wavelength range as means for testing their optical performance and characteristics. Herein, the broadband light source may be also used in generating light over a wide wavelength range for inducing a mode-lock of each Fabry-Perot laser for generating the channels.

A rare-earth doped fiber amplifier capable of generating a spontaneous emission light having a predetermined wavelength band, or a semiconductor optical amplifier may be used as the broadband light source. However, since the broadband light source has low output power, its use is limited.

Figure 1:
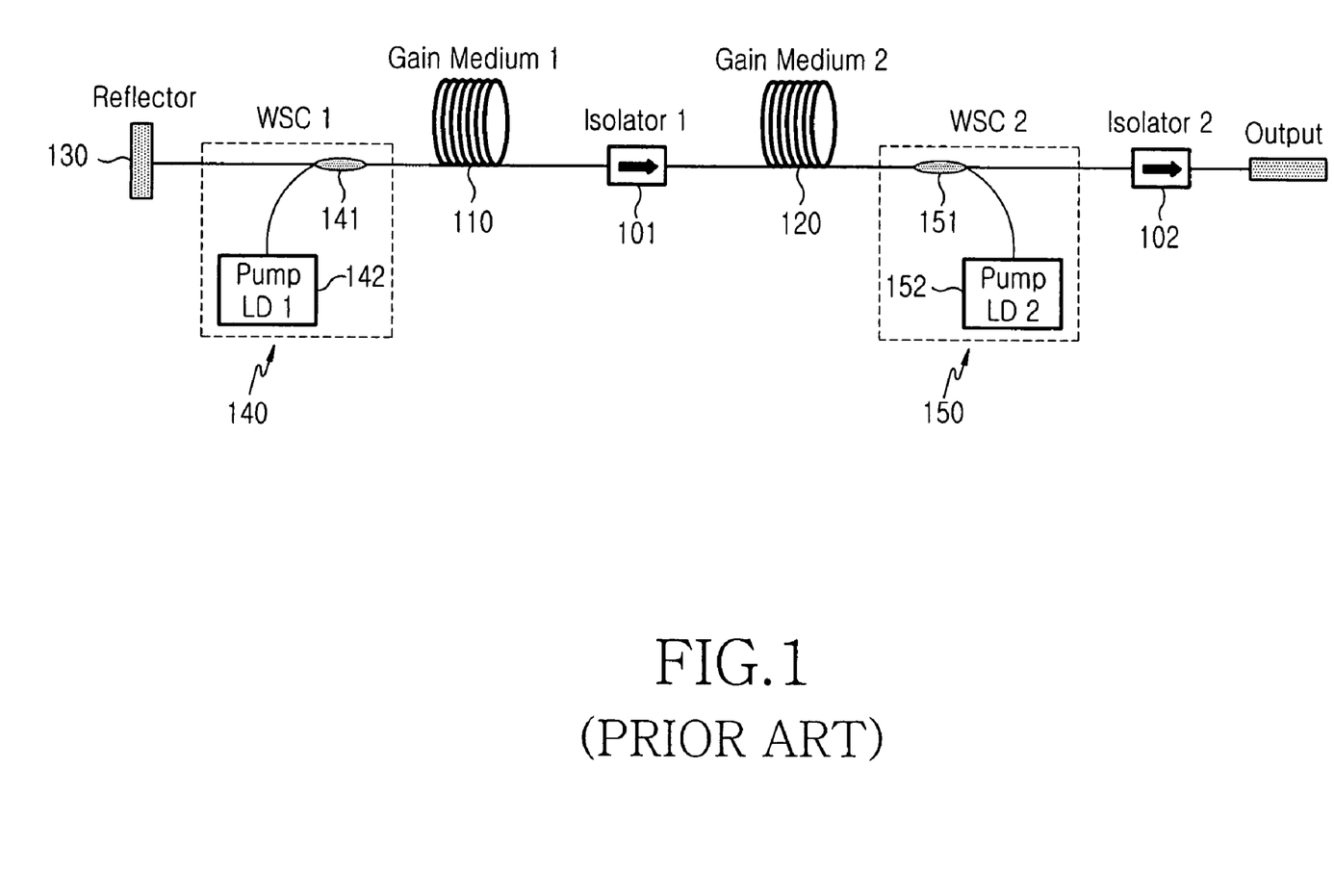
FIG. 1 is a view showing a construction of a conventional broadband light source.

FIG. 1 is a view showing a construction of a conventional broadband light source. Referring to FIG. 1, the conventional multi-wavelength light source includes a first amplifying medium 110, a second amplifying medium 120, a first pumping means 140 for pumping a first pumping light to the first amplifying medium 110, a second pumping means 150 for pumping a second pumping light to the second amplifying medium 120, a first isolator 101 located between the first and the second amplifying mediums 110 and 120, a second isolator 102, and a reflector 130.

The first amplifying medium 110 outputs an L-band spontaneous emission light at both sides, and amplifies the L-band spontaneous emission light reflected by the reflector 130 to output the amplified spontaneous emission light to the first isolator 101.

The first pumping means 140 includes a first pump light source 142 for generating the first pumping light for pumping the first amplifying medium 110, and a first wavelength selective coupler 141 for outputting the first pumping light generated from the first pump light source to the first amplifying medium.

The first wavelength selective coupler 141 is located between the reflector 130 and the first amplifying medium 110 in order to output the L-band spontaneous emission light generated from the first amplifying medium to the reflector and to output the L-band spontaneous emission light reflected by the reflector to the first amplifying medium.

The second pumping means 150 includes a second pump light source 152 for generating the second pumping light, and a second wavelength selective coupler 151 for outputting the second pumping light generated from the second pump light source to the second amplifying medium 120.

The second pump light source 152 outputs the second pumping light for pumping the second amplifying medium 120 to the second wavelengths elective coupler 151 and may employ a photo diode.

The second wavelength selective coupler 151 outputs L-band and C-band spontaneous emission lights, which are outputted from the second amplifying medium 120, to the second isolator 102.

The second amplifying medium 120 is pumped by the second pumping light to generate the C-band spontaneous emission light, and amplifies the L-band spontaneous emission light inputted from the first isolator 101 to output the amplified spontaneous emission light to the second wavelength selective coupler 151.

The second isolator 102 outputs the L-band and C-band spontaneous emission lights to an exterior of the broadband light source through an output terminal 'Output', and blocks light progressing in reverse from the output terminal 'Output' to the second amplifying medium 120.

In the conventional broadband light source, the first amplifying medium amplifies the L-band spontaneous emission light reflected by the reflector, and the second amplifying medium amplifies again the L-band spontaneous emission light amplified by the first amplifying medium. Therefore, the broadband light source has high amplification efficiency for the L-band spontaneous emission light.

However, the conventional reflector cannot simultaneously have a wide wavelength band and a high reflection factor.

SUMMARY OF THE INVENTION

The present invention has been made to solve the above-mentioned problems occurring in the prior art, and an object of the present invention is to provide a broadband light source capable of generating light over a wide wavelength range with high power.

In order to accomplish the aforementioned objects, according to one aspect of the present, there is provided a broadband light source that includes an optical amplifier having amplifying mediums connected in series. The optical amplifier outputs forward and backward amplified spontaneous emission light over a wide wavelength range. Further included in the light source is a circulator connected in series to the optical amplifier, for returning back the spontaneous emission light outputted backwardly from the optical amplifier. A first pumping means is located between the circulator and the optical amplifier, for pumping a pumping light to the optical amplifier. A second pumping means is located after the optical amplifier, for pumping a pumping light to the optical amplifier.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION

A preferred embodiment according to the present invention is described with reference to the accompanying drawings. In the following description of the present invention, details of known functions and configuration incorporated herein omitted for clarity of presentation.

A broadband light source according to the present invention sends light having been outputted from an amplifier including one or more amplifying mediums back to the amplifier through a circulator, thereby minimizing the optical loss in comparison with the prior art, in which the light is reflected through a reflector, and stably amplifying light having a wider wavelength band.

Figure 2:
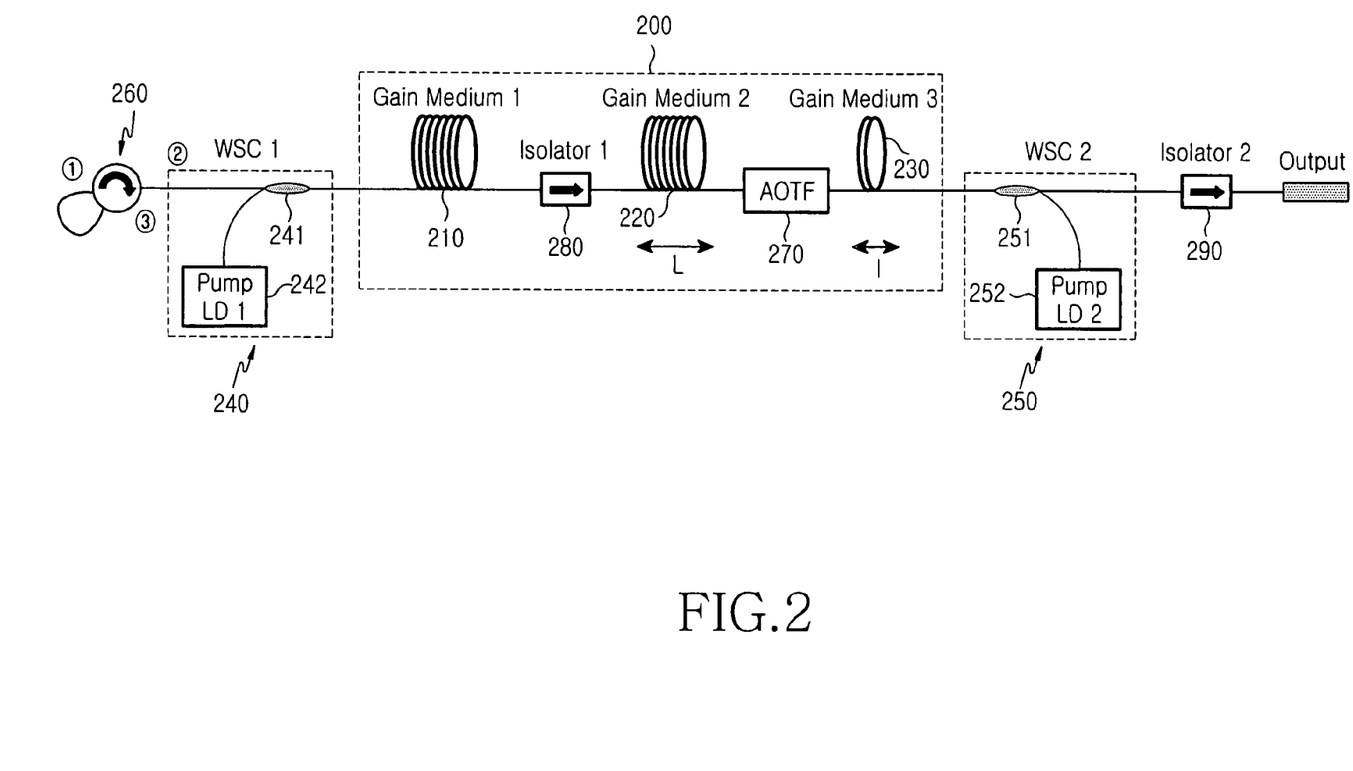
FIG. 2 is a view showing a construction of a broadband light source according to a first embodiment of the present invention.

FIG. 2 is a view showing a construction of a broadband light source according to a first embodiment of the present invention. The broadband light source includes an optical amplifier 200, a circulator 260, a first pumping means 240, a second pumping means 250, and a second isolator 290. The optical amplifier 200 outputs forward or backward a spontaneous emission light over a wide wavelength range. The circulator 260 is connected in series to the optical amplifier 200 and returns to the optical amplifier the spontaneous emission light outputted backward from the optical amplifier. The first pumping means 240 located before the optical amplifier 200, and the second pumping means 250 located after the optical amplifier, pump respective pumping light to the optical amplifier.

The optical amplifier 200 includes a plurality of amplifying mediums 210 to 230 connected in series with each other, and outputs forward or backward amplified spontaneous emission light over the wide wavelength range. Each of the amplifying mediums 210 to 230 may use a semiconductor optical amplifier or a rare-earth doped fiber amplifier. The rare-earth doped fiber amplifier may adjust a wavelength range of generated light by adjusting its length, whereas each of the amplifying mediums 210 to 230 may generate or amplify lights having different wavelengths through the use of semiconductor optical amplifiers having different band gaps.

The optical amplifier 200 includes a first amplifying medium 210 for generating and amplifying C-band and L-band spontaneous emission lights, a second amplifying medium 220 for secondarily amplifying the L-band spontaneous emission light amplified by the first amplifying medium, a third amplifying medium 230 for thirdly amplifying the secondarily amplified L-band spontaneous emission light, a first isolator 280 located between the first and the second amplifying mediums, and an acoustic-optic tunable filter (hereinafter, referred to as an AOTF) 270 located between the second and third amplifying mediums. The L-band spontaneous emission light has a wavelength range of 1570~1620 nm and the C-band spontaneous emission light has a wavelength range of 1520~1270 nm.

The first pumping means 240 is located between the circulator 260 and the first amplifying medium 210, and includes the first wavelength selective coupler 241 connected to a first pump light source 242. The first pump light source 242 generates a first pumping light for pumping the first amplifying medium, thereby pumping the first pump light to the optical amplifier 200.

The second pumping means 250 includes a second pump light source 252 for generating a second pumping light and a second wavelength selective coupler 251 for outputting the C-band and L-band spontaneous emission lights amplified by the third amplifying medium 230 to an exterior of the third amplifying medium 230 and for inputting the second pumping light to the third amplifying medium 230 and thus to the optical amplifier 200.

Pumping of the first amplifying medium 210 by the first pumping means 240 generates C-band and L-band spontaneous emission lights. The first amplifying medium 210 is secondarily pumped by the C-band spontaneous emission light returned by the circulator 260, thereby amplifying the L-band spontaneous emission light which will be outputted to the first isolator 280 and then to the second amplifying medium 220. The first amplifying medium 210 may include a rare-earth doped fiber amplifier of significant length or a semiconductor optical amplifier having a predetermined band gap so as to be pumped by the first pumping means 240 to generate the C-band and L-band spontaneous emission lights. The first amplifying medium 210 outputs the C-band spontaneous emission light at the end connected to the first pumping means 240.

The second amplifying medium 220 generates C-band spontaneous emission light through the backward pumping by the second pumping means 250, and secondarily amplifies the L-band spontaneous emission light inputted from the first amplifying medium 210.

The third amplifying medium also 230 generates C-band spontaneous emission light through a backward pumping by the second pumping means 250, and thirdly amplifies the L-band spontaneous emission light secondarily amplified by the second amplifying medium 220.

Each of the second and the third amplifying mediums 220, 230 uses a rare-earth doped fiber amplifier having length different from that of the first amplifying medium 210 or semiconductor optical amplifiers having different band gaps, thereby generating a spontaneous emission light in a wavelength range different from that of the L-band spontaneous emission light amplified by the first amplifying medium 210.

The first isolator 280 is located between the first amplifying medium 210 and the second amplifying medium 220 in order to output the L-band spontaneous emission light, which is inputted from the first amplifying medium 210, to the second amplifying medium 220 and to prevent the C-band spontaneous emission light generated from the second amplifying medium from being inputted to the first amplifying medium.

The circulator 260 is connected in series to the first pumping means 240, and sends the C-band spontaneous emission light inputted from the first pumping means 240 back to the optical amplifier 200 through a first wavelength selective coupler 241. That is, the circulator 260 receives the C-band spontaneous emission light by means of its second port, outputs it through its third port which is connected to return the light to the first port. The first port outputs the C-band spontaneous emission light to the first wavelength selective coupler 241 through the second port.

Generally, it is difficult to manufacture a reflector having a uniform reflection factor over a wide wavelength band. The circulator 260, by contrast, is capable of returning the C-band spontaneous emission light inputted from the optical amplifier 200 back to the optical amplifier with minimum loss over an entire wavelength band.

The AOTF 270 is located between the second amplifying medium 220 and the third amplifying medium 230 in order to gain-flatten the C-band and L-band spontaneous emission lights outputted from the second amplifying medium 220 and to output the flattened spontaneous emission lights to the third amplifying medium 230.

Further, the second amplifying medium 220 and the third amplifying medium 230 include rare-earth doped fiber amplifiers having different lengths, so that the loss of the amplified C-band and L-band spontaneous emission lights can be minimized and an improved gain flattening effect can be obtained. That is, each of the second amplifying medium 220 and the third amplifying medium 230 amplifies C-band spontaneous emission lights in different wavelength ranges even from among the C-band spontaneous emission lights, so that an output spectrum is flattened without incurring a loss of the amplified spontaneous emission light.

Specifically, when the third amplifying medium 230 has length corresponding to 3~10% of the length of the second amplifying medium 220, the broadband light source can flatten a C-band spontaneous emission light output spectrum.

Figure 4:
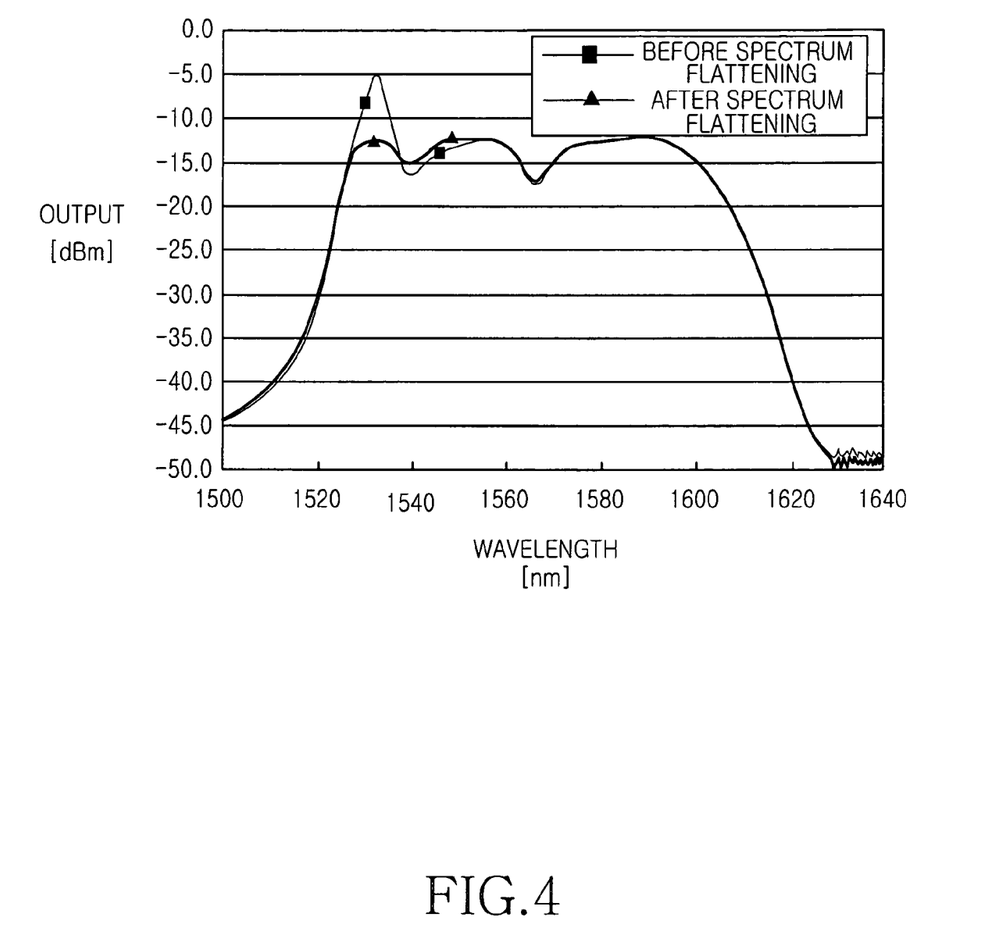
FIG. 4 is a graph showing comparison between spectrums before and after flattening, which are outputted from the broadband light source according to the first embodiment of the present invention.
Figure 5:
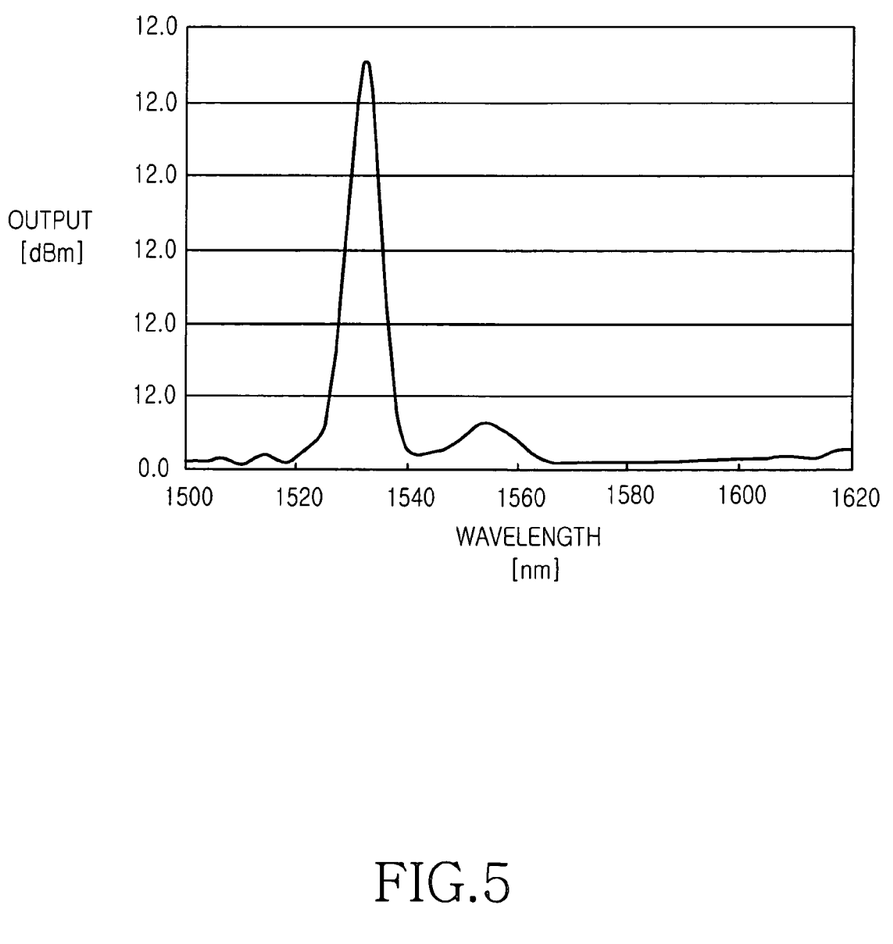
FIG. 5 is a graph showing optical loss in acoustic-optic tunable filter shown in FIG. 2.

FIG. 4 is a graph affording comparison of the spectrum of the output of the broadband light source before and after flattening, according to the first embodiment of the present invention. FIG. 5 is a graph showing optical loss in the AOTF 270 shown in FIG. 2. Referring to FIG. 4, the C-band spontaneous emission light output spectrum before being flattened has a highest point at a wavelength band of 1530 nm, is flattened at a wavelength band of 1540 nm, and then increases by about 2 dB.

Referring to FIG. 5, large loss occurs at wavelengths of 1530 nm and 1550 nm. However, as described in FIG. 4, as the intensity of the portion having the low intensity increases, flattening spreads throughout the C-band or L-band spontaneous emission light output spectrum.

The second isolator 290 outputs the C-band and L-band spontaneous emission lights outputted from the second wavelength selective coupler 251 to an exterior of the broadband light source through an output terminal 'Output', and blocks light progressing in reverse from the output terminal 'Output' to the second wavelength selective coupler 251.

Figure 3:
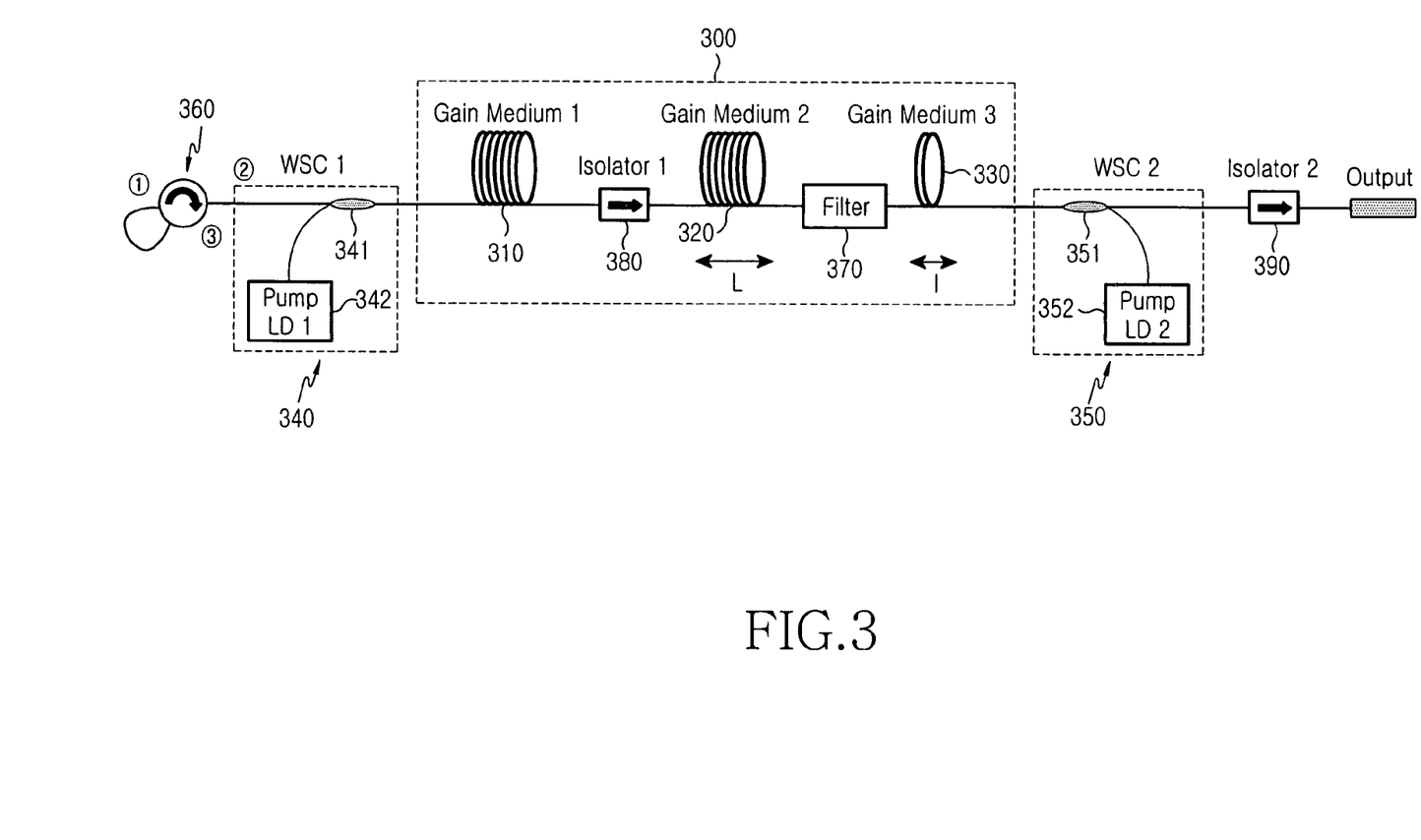
FIG. 3 is a view showing a construction of a broadband light source according to a second embodiment of the present invention.

FIG. 3 is a view showing a construction of a broadband light source according to a second embodiment of the present invention. Referring to FIG. 3, the broadband light source includes an optical amplifier 300, a first pumping means 340, a second pumping means 350, a circulator 360, and a second isolator 390. The optical amplifier 300 outputs forward or backward an amplified spontaneous emission light over a wide wavelength range. The circulator 360 is connected in series to the optical amplifier 300, and returns the spontaneous emission light issuing from the back end of the optical amplifier back to the optical amplifier. The first pumping means 340 located before the optical amplifier 300 pumps a pumping light forward to the optical amplifier, and the second pumping means 350 located after the optical amplifier pumps a pumping light backward to the optical amplifier.

The optical amplifier 300 includes a first amplifying medium 310 for generating and amplifying C-band and L-band spontaneous emission lights, a second amplifying medium 320 for secondarily amplifying the L-band spontaneous emission light amplified by the first amplifying medium 310, a third amplifying medium 330 for thirdly amplifying the L-band spontaneous emission light, a first isolator 380 located between the first amplifying medium 310 and the second amplifying medium 320, and a gain flattening filter 370 located between the second amplifying medium and the third amplifying medium. The gain flattening filter 370 may use a thin-film type gain flattening filter having different quantity of loss according to a predetermined wavelength.

The first pumping means 340 includes a first wavelength selective coupler 341 and a first pumping light source 342 in order to pump the pumping light to the optical amplifier 300. The second pumping means 350 includes a second wavelength selective coupler 351 and a second pumping light source 352 in order to pump the pumping light to the optical amplifier 300. Both the first pumping means 340 and the second pumping means 350 output the generated or amplified spontaneous emission lights to an exterior of the broadband light source. Further description would be repetitive with that of the first embodiment and is omitted.

Figure 6:
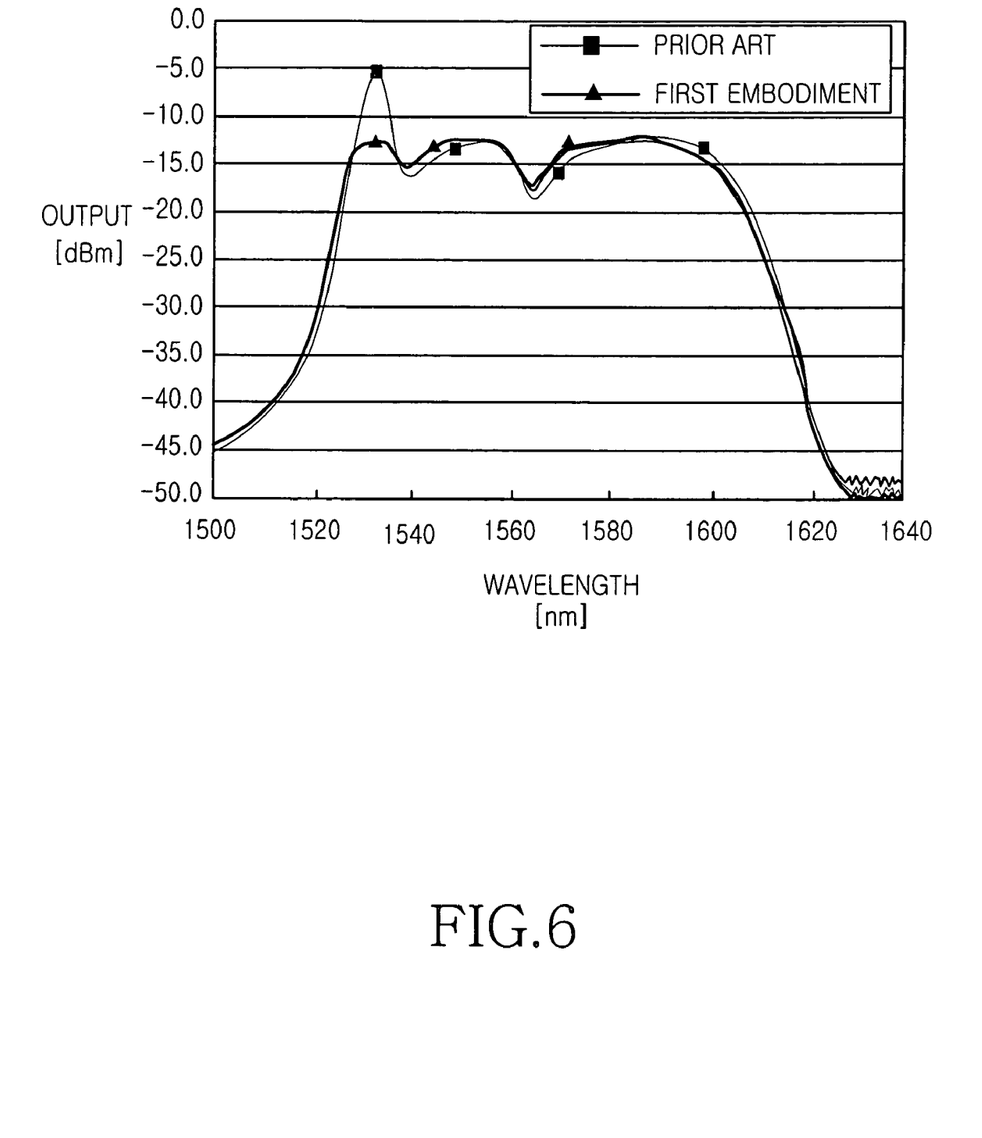
FIG. 6 is a graph showing comparison between a spectrum outputted from the broadband light source in the prior art and a spectrum outputted from the broadband light source according to the first embodiment of the present invention.

FIG. 6 is a graph showing comparison between a spectrum outputted from the broadband light source in the prior art and a spectrum outputted from the broadband light source according to the first embodiment of the present invention. As shown, C-band and L-band spontaneous emission lights flattened with a higher gain efficiency are obtained in comparison with the prior art.

A broadband light source according to the present invention returns a spontaneous emission light generated from an amplifier back to the amplifier by a circulator, thereby amplifying a spontaneous emission light over a wide wavelength range with high gain efficiency in comparison with a broadband light source which reflects a spontaneous emission light by means of a mirror.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A broadband light source comprising:
    an optical amplifier including a plurality of amplifying mediums connected in series, said amplifier being configured for outputting forward and backward amplified spontaneous emission light over a wide wavelength range;
    a circulator comprising first to third ports and being connected in series to the optical amplifier, the second port of the circulator is configured to receive the backwardly outputted light from the optical amplifier and output the received light to the first port via the third port coupled the first port, and the first port is configured to output the light received from the third port and for returning the received light to the optical amplifier via the second port;
    a first pumping means located between the circulator and the optical amplifier, for pumping a pumping light to the optical amplifier; and a second pumping means located after the optical amplifier, for pumping a pumping light to the optical amplifier.

2. The broadband light source as claimed in claim 1, wherein said plurality comprises:
   a first amplifying medium for generating and amplifying C-band and L-band spontaneous emission lights, and amplifying the L-band spontaneous emission light by C-band spontaneous emission light returned by the circulator;
   a second amplifying medium for generating C-band spontaneous emission light through a backward pumping by the second pumping means, and secondarily amplifying the L-band spontaneous emission light amplified by the first amplifying medium; and
   a third amplifying medium for generating C-band spontaneous emission light through a backward pumping by the second pumping means, and thirdly amplifying the L-band spontaneous emission light secondarily amplified by the second amplifying medium.

3. The broadband light source as claimed in claim 2, wherein each of the first to third amplifying mediums includes a rare-earth doped fiber amplifier.

4. The broadband light source as claimed in claim 2, wherein the third amplifying medium includes a rare-earth element optical fiber amplifier having length corresponding to 3~10% of length of the second amplifying medium.

5. The broadband light source as claimed in claim 2, wherein the optical amplifier further comprises:
   a first isolator located between the first amplifying medium and the second amplifying medium, for outputting the L-band spontaneous emission light to the second amplifying medium, and for preventing C-band spontaneous emission light generated from the second amplifying medium from being inputted to the first amplifying medium; and
   a gain flattening filter located between the second amplifying medium and the third amplifying medium, for gain-flattening L-band and C-band spontaneous emission lights outputted from the second amplifying medium to output the flattened spontaneous emission lights to the third amplifying medium.

6. The broadband light source as claimed in claim 5, wherein the filter comprises an acoustic-optic tunable filter.

7. The broadband light source as claimed in claim 5, said source having an output terminal, the second pumping means being located between said optical amplifier and the output terminal, said source further having an isolator located between the second pumping means and the output terminal, the second pumping means having a wavelength selective coupler, the isolator outputting to an output terminal of the broadband light source C-band and L-band spontaneous emission lights outputted from the wavelength selective coupler, the isolator blocking light progressing in reverse from the output terminal to the wavelength selective coupler.

8. The broadband light source as claimed in claim 2, said source having an output terminal, the second pumping means being located between said optical amplifier and the output terminal, said source further having an isolator located between the second pumping means and the output terminal, the second pumping means having a wavelength selective coupler, the isolator outputting to an output terminal of the broadband light source C-band and L-band spontaneous emission lights outputted from the wavelength selective coupler, the isolator blocking light progressing in reverse from the output terminal to the wavelength selective coupler.

9. The broadband light source as claimed in claim 1, said source having an output terminal, the second pumping means being located between said optical amplifier and the output terminal, said source further having an isolator located between the second pumping means and the output terminal, the second pumping means having a wavelength selective coupler, the isolator outputting to an output terminal of the broadband light source C-band and L-band spontaneous emission lights outputted from the wavelength selective coupler, the isolator blocking light progressing in reverse from the output terminal to the wavelength selective coupler.

10. The broadband light source as claimed in claim 1, wherein the first pumping means comprises:
    a first wavelength selective coupler located between the circulator and the first amplifying medium, for inputting and outputting C-band spontaneous emission light outputted from the first amplifying medium; and
    a first pumping light source for outputting a first pumping light for pumping the first amplifying medium to the first amplifying medium through the first wavelength selective coupler.

11. The broadband light source as claimed in claim 10, wherein said plurality comprises:
    a first amplifying medium for generating and amplifying C-band and L-band spontaneous emission lights, and amplifying the L-band spontaneous emission light by C-band spontaneous emission light returned by the circulator;
    a second amplifying medium for generating C-band spontaneous emission light through a backward pumping by the second pumping means, and secondarily amplifying the L-band spontaneous emission light amplified by the first amplifying medium; and
    a third amplifying medium for generating C-band spontaneous emission light through a backward pumping by the second pumping means, and thirdly amplifying the L-band spontaneous emission light secondarily amplified by the second amplifying medium.

12. The broadband light source as claimed in claim 11, wherein each of the first to third amplifying mediums includes a rare-earth doped fiber amplifier.

13. The broadband light source as claimed in claim 1, wherein the second pumping means comprises:
    a second pumping light source for generating a second pumping light; and
    a second wavelength selective coupler for outputting C-band and L-band spontaneous emission lights amplified by the third amplifying medium to an exterior of the third amplifying medium, and for inputting the second pumping light to the third amplifying medium.

14. The broadband light source as claimed in claim 13, wherein said plurality comprises:
    a first amplifying medium for generating and amplifying C-band and L-band spontaneous emission lights, and amplifying the L-band spontaneous emission light by C-band spontaneous emission light returned by the circulator;
    a second amplifying medium for generating C-band spontaneous emission light through a backward pumping by the second pumping means, and secondarily amplifying the L-band spontaneous emission light amplified by the first amplifying medium; and a third amplifying medium for generating C-band spontaneous emission light through a backward pumping by the second pumping means, and thirdly amplifying the L-band spontaneous emission light secondarily amplified by the second amplifying medium.

15. The broadband light source as claimed in claim 14, wherein each of the first to third amplifying mediums includes a rare-earth doped fiber amplifier.

16. A broadband light source having an output end, said source comprising:
   an optical amplifier including a plurality of amplifying mediums connected in series, said amplifier being configured for outputting forward and backward amplified spontaneous emission light over a wide wavelength range;
   a circulator comprising first to third ports and being connected in series to the optical amplifier, the second port of the circulator is configured to receive one of the backwardly and forwardly outputted light from the optical amplifier and output the received light to the first port via the third port coupled to the first port, and the first port is configured to output the light received from the third port to the optical amplifier through the second port;
   a first pumping means located between the circulator and the optical amplifier, for pumping a pumping light to the optical amplifier; and
   a second pumping means located between the optical amplifier and said output end, for pumping a pumping light to the optical amplifier.

17. The broadband light source as claimed in claim 16, wherein said plurality comprises:
   a first amplifying medium for generating and amplifying C-band and L-band spontaneous emission lights, and amplifying the L-band spontaneous emission light by C-band spontaneous emission light returned by the circulator;
   a second amplifying medium for generating C-band spontaneous emission light through a backward pumping by the second pumping means, and secondarily amplifying the L-band spontaneous emission light amplified by the first amplifying medium; and
   a third amplifying medium for generating C-band spontaneous emission light through a backward pumping by the second pumping means, and thirdly amplifying the L-band spontaneous emission light secondarily amplified by the second amplifying medium.

18. The broadband light source as claimed in claim 17, wherein each of the first to third amplifying mediums includes a rare-earth doped fiber amplifier.

19. The broadband light source as claimed in claim 17, wherein the third amplifying medium includes a rare-earth element optical fiber amplifier having length corresponding to 3~10% of length of the second amplifying medium.

20. The broadband light source as claimed in claim 17, wherein the optical amplifier comprises:
   a first isolator located between the first amplifying medium and the second amplifying medium, for outputting the L-band spontaneous emission light to the second amplifying medium, and for preventing C-band spontaneous emission light generated from the second amplifying medium from being inputted to the first amplifying medium; and
   a gain flattening filter located between the second amplifying medium and the third amplifying medium, for gain-flattening L-band and C-band spontaneous emission lights outputted from the second amplifying medium to output the flattened spontaneous emission lights to the third amplifying medium.

\* \* \* \* \*